United States Patent
Park et al.

[11] Patent Number: 6,037,272
[45] Date of Patent: Mar. 14, 2000

[54] APPARATUS AND METHOD FOR LOW PRESSURE CHEMICAL VAPOR DEPOSITION USING MULTIPLE CHAMBERS AND VACUUM PUMPS

[75] Inventors: Jun Sig Park; Young Sun Kim, both of Kyungki-do; Jung Ki Kim, Seoul, all of Rep. of Korea

[73] Assignee: Samsung Electronics Co., Ltd., Suwon, Rep. of Korea

[21] Appl. No.: 09/152,674

[22] Filed: Sep. 14, 1998

Related U.S. Application Data

[62] Division of application No. 08/906,879, Aug. 6, 1997, Pat. No. 5,873,942.

[30] Foreign Application Priority Data

Aug. 8, 1996 [KR] Rep. of Korea ................... 96-33044

[51] Int. Cl.[7] ............................ H01L 21/00; C23C 16/00
[52] U.S. Cl. ...................... 438/758; 438/908; 438/909; 438/935; 427/248.1; 427/255.7; 29/25.01
[58] Field of Search ............................ 118/715, 719; 204/298.07, 298.25, 298.35; 156/345; 417/205, 248, 306, 427, 441, 63; 427/248.1, 255.7; 438/758, 908, 909, 935; 29/25.01

[56] References Cited

U.S. PATENT DOCUMENTS

| | | | |
|---|---|---|---|
| 4,442,338 | 4/1984 | Yamazaki ...................... 219/121 PE |
| 4,592,306 | 6/1986 | Gallego ............................ 118/719 |
| 4,636,401 | 1/1987 | Yamazaki et al. ..................... 427/39 |
| 4,655,800 | 4/1987 | Tsukada et al. ..................... 55/195 |
| 4,693,777 | 9/1987 | Hazano et al. .................... 156/345 |
| 4,725,204 | 2/1988 | Powell ........................... 417/205 |
| 4,824,545 | 4/1989 | Arnold et al. ..................... 204/298 |
| 4,867,859 | 9/1989 | Harada et al. ..................... 204/298 |
| 4,895,107 | 1/1990 | Yano et al. ....................... 118/722 |
| 4,975,168 | 12/1990 | Ohno et al. ..................... 204/192.13 |
| 5,039,280 | 8/1991 | Saulgeot et al. .................... 417/205 |
| 5,076,205 | 12/1991 | Vowles et al. ..................... 118/719 |
| 5,183,511 | 2/1993 | Yamazaki et al. .................. 118/723 E |
| 5,186,718 | 2/1993 | Tepman et al. ..................... 29/25.01 |
| 5,286,296 | 2/1994 | Sato et al. ....................... 118/719 |
| 5,288,329 | 2/1994 | Nakamura et al. .................. 118/729 |
| 5,609,689 | 3/1997 | Kato et al. ....................... 118/719 |
| 5,695,564 | 12/1997 | Imahashi ........................ 118/719 |
| 5,863,842 | 1/1999 | Ohmi ............................ 438/758 |
| 5,873,942 | 2/1999 | Park et al. ....................... 118/719 |

FOREIGN PATENT DOCUMENTS 63-270388  11/1988  Japan .
1-313388   12/1989  Japan .

*Primary Examiner*—Jeffrie R Lund
*Attorney, Agent, or Firm*—Jones Volentine, LLP

[57] ABSTRACT

An apparatus for low pressure chemical vapor deposition for fabricating a semiconductor device comprises a group of reaction chambers, a group of high-vacuum pumps connected to the reaction chambers, a group of gate valves connected to the high-vacuum pumps, and a low-vacuum pump connected to the gate valves. There are fewer gate valves than high-vacuum pumps. A method for fabricating a semiconductor device using the above apparatus includes the sequence and duration of opening gate valves, injecting reaction gases, and pumping with the low vacuum pump. According to the present invention, since the number of pumps is reduced, the cost for installation, operation and maintenance of the semiconductor device fabrication apparatus is reduced.

6 Claims, 6 Drawing Sheets

APPARATUS AND METHOD FOR LOW PRESSURE CHEMICAL VAPOR DEPOSITION USING MULTIPLE CHAMBERS AND VACUUM PUMPS

CROSS REFERENCE TO RELATED APPLICATIONS

This is a divisional application of application Ser. No. 08/906,879, filed Aug. 6, 1997 now U.S. Pat. No. 5,873,942.

BACKGROUND OF THE INVENTION

1. Field of the Invention

The present invention relates to an apparatus for fabricating a semiconductor device and a method for using the same. More particularly, the present invention relates to an apparatus and method for low pressure chemical vapor deposition utilizing multiple chambers and vacuum pumps.

2. Description of the Related Art

In a general low pressure chemical vapor deposition (LPCVD) apparatus, a plurality of reaction chambers rather than a single chamber are used by connecting the reaction chambers to a common wafer transfer chamber. When a process such as a thin film forming process is conducted in each of the multiple reaction chambers, a source gas is introduced into each chamber. When the process is finished, the remaining source gas within the reaction chamber must be completely evacuated before the next process can begin.

The serial supply and evacuation of source gas cannot be performed without utilizing pumping equipment connected to the plurality of reaction chambers. For a typical process, the internal pressure of the reaction chamber must be maintained close to a given target pressure during a period from before the introduction of a source gas to a predetermined time after the supply of that gas has stopped. The given target pressure condition is necessary to ensure efficient formation of the thin film within desired tolerances.

In general, the pressure within the reaction chamber varies before, during, and after the introduction of the source gas. That is, in an initial time interval before the gas is introduced, the inside of the reaction chamber must be maintained at a constant high vacuum state, for example at pressures of $10^{-4}$ Torr or below, to completely remove impurities from the other gases formerly introduced into the reaction chamber. When the gas is introduced the target pressure can be significantly higher than the initial pressure, for example, the target pressure for a thin film deposition process can be $10^{-3}$ or greater. After the deposition process, the supply of source gas is cut off, and the pressures must be returned to the high-vacuum state of the initial time interval to remove the source gas and other impurities.

A high-vacuum pump is required to keep the internal pressure of the reaction chamber at the very low pressures during the initial state, e.g., less than $10^{-4}$ Torr. Thus, a high-vacuum pump is connected to each reaction chamber. Also, a low-vacuum pump is connected to each reaction chamber to assist the high-vacuum pump.

The low-vacuum pump is used when a large load is applied to the high-vacuum pump, that is, when the source gas flows into the reaction chamber. When the source gas flows into the reaction chamber faster than the high-vacuum pump can remove it, the internal pressure of the reaction chamber increases with time. In addition, to reach the target pressure the internal pressure of the reaction chamber must be increased above the design pressure of most high-vacuum pumps. Thus, to maintain the inside of the reaction chamber at a target pressure, and to return the internal pressure of the reaction chamber to the initial state after the process, a low-vacuum pump is needed to assist the high-vacuum pump.

However, when a source gas is not being supplied to the reaction chamber, and after the pressure in the reaction chamber has decreased sufficiently to be within the design range of the high-vacuum pump, the high-vacuum pump is used alone to simply maintain the reaction chamber at a constant initial pressure.

A conventional LPCVD apparatus for manufacturing a semiconductor device includes a plurality of reaction chambers and pumping equipment connected to the reaction chambers. The conventional LPCVD apparatus and the method of using it are described with reference to the attached drawings.

FIG. 1 shows a plurality of reaction chambers and pumping equipment connected thereto which comprises a conventional LPCVD apparatus for manufacturing a semiconductor device. FIG. 2 shows the timing charts for fabricating a semiconductor device using the LPCVD apparatus having the configuration shown in FIG. 1.

Referring to FIG. 1, a conventional LPCVD apparatus for manufacturing a semiconductor device comprises a plurality of pumping components connected to a plurality of reaction chambers. A first load lock chamber 16 and a second load lock chamber 18 allow a wafer to be placed into the apparatus before starting a process. First, second, and third reaction chambers 10, 12 and 14, respectively, are used for performing various semiconductor fabricating processes. A transfer chamber 8 transfers wafers from the load lock chambers 16 and 18 to the reaction chambers 10, 12 and 14, and back, and is positioned between the load lock chambers 16 and 18 and the reaction chambers 10, 12 and 14.

A pair of high-vacuum pumps 10a and 10b are connected in parallel to the first reaction chamber 10. A low-vacuum pump 10e is connected in series to the pair of high-vacuum pumps 10a and 10b through a pair of gate valves 10c and 10d, respectively. The two high-vacuum pumps 10a and 10b connected to the first reaction chamber 10 are referred to as the first and second high-vacuum pumps, respectively.

The second reaction chamber 12 is similarly connected to two parallel high-vacuum pumps 12a and 12b and in series through two gate valves 12c and 12d, respectively, to a low-vacuum pump 12e. Finally, the third reaction chamber 14 is similarly connected to two parallel high-vacuum pumps 14a and 14b and in series through two gate valves 14c and 14d, respectively, to a low-vacuum pump 14e. The two high-vacuum pumps 12a and 12b connected to the second reaction chamber 12 are referred to as the third and fourth high-vacuum pumps, respectively. Also, the two high-vacuum pumps 14a and 14b connected to the third reaction chamber 14 are referred to as the fifth and sixth high-vacuum pumps, respectively. The three low-vacuum pumps 10e, 12e and 14e, respectively connected to the first, second, and third reaction chambers 10, 12 and 14, are referred to as the first, second and third low-vacuum pumps, respectively.

The two gate valves 10c and 10d between the first and second high-vacuum pumps 10a and 10b, and the first low-vacuum pump 10e, are referred to as the first and second gate valves, respectively. The two gate valves 12c and 12d between the third and fourth high-vacuum pumps 12a and 12b, and the second low-vacuum pump 12e are referred to as the third and fourth gate valves, respectively. Finally, the two gate valves 14c and 14d between the fifth and sixth high-vacuum pumps 14a and 14b, and the third low-vacuum pump 14e are referred to as the fifth and sixth gate valves, respectively.

In the conventional LPCVD apparatus, the pumping equipment consists of a pumping component connected to each reaction chamber. The pumping component consists of two high-vacuum pumps, two gate valves, and one low-vacuum pump. A process using the conventional LPCVD technology is described with reference to FIG. 2.

FIG. 2 shows the operation of the first through sixth gate valves (10c, 10d, 12c, 12d, 14c and 14d in FIG. 1), the operation of the first through sixth high-vacuum pumps (10a, 10b, 12a, 12b, 14a and 14b in FIG. 1), and the first through third low-vacuum pumps (10e, 12e and 14e in FIG. 1) as determined by whether the reaction gas is supplied or not to the first through third reaction chambers 10, 12, and 14. In detail, reference numerals 20, 22 and 24 are timing charts for illustrating the pressure state of the first through third reaction chambers 10, 12, and 14 over a given period of time. Reference numerals 26,27, and 28 are timing charts for opening and closing the three pairs of gate valves associated with the first through third reaction chambers, respectively.

Referring to the timing chart 20 of the first reaction chamber 10, the wafer loaded therein is heated for a period of time called a first time section 20a ("Temp Inc") to a predetermined temperature, such as an appropriate depositing temperature for forming a thin film. After the first time section 20a, a reaction gas is introduced into the first reaction chamber 10 for a period of time referred to as a second time section 20b ("Gas Flow"). In the second time section 20b, the internal pressure of the first reaction chamber 10 increases as illustrated by time chart 20. For example, in a thin film deposition process the internal pressure 20 is about $10^{-7}$ Torr during time section 20a. However, the internal pressure 20 increases to about $10^{-3}$ Torr in the second time section 20b. Thus, the first and second high-vacuum pumps 10a and 10b are operated together with the first low-vacuum pump 10e during the second time section 20b.

The reaction gas is cut off at the end of time section 20b and does not flow during a third time section 20c ("Anneal"). The gas that remains from time section 20b is evacuated at the beginning of time section 20c until the first reaction chamber internal pressure 20 returns to its initial value. Time section 20c continues for a predetermined duration depending on the specific process. For example, during time section 20c, an annealing step in a thin film formation process is conducted for stabilizing the thin film, and the remaining gas within the first reaction chamber 10 is removed to clean the inside of the first reaction chamber in order to prevent impurities from being additionally deposited on the wafer. In the third time section 20c, after the pressure 20 of the first reaction chamber returns to the initial state, the first and second high-vacuum pumps 10a and 10b can be operated alone. During time sections 20a through 20c, the first and second gate valves associated with the first reaction chamber 10 connected thereto are always open as illustrated by time chart 26.

While the first reaction chamber 10 operates in the first and second time sections 20a and 20b as shown in the time chart 20, the second reaction chamber 12 operates in a fourth time section 22a as shown in time chart 22. For example, the second chamber 12 may be performing an annealing process and stabilizing the wafer by heating the same. Later, while the first reaction chamber 10 is in the third time section 20c, the second reaction chamber 12 goes through a fifth time section 22b when a gas is introduced and the chamber pressure increases to a low-vacuum state, and through a sixth time section 22c when the gas is removed and the chamber returns to a high-vacuum state. For example, in a thin film formation process a reaction gas is supplied during time section 22b and an annealing process occurs during time section 22c.

Simultaneously, the third reaction chamber 14 begins in a seventh time section 24a at the high-vacuum state as shown in time chart 24. For example, time section 24a can be utilized for annealing the wafer and stabilizing it by heating it to a predetermined temperature. While both the first reaction chamber 10 and the second reaction chamber 12 are in the high vacuum state during times sections 20c and 22c, respectively, the third reaction chamber 14 has a gas that is introduced during an eighth time section 24b. Then the gas is evacuated during a ninth time section 24c. For example, a thin film can be formed on the wafer during the eighth time section 24b, and a subsequent annealing process can occur in the ninth time section 24c.

In the second and third reaction chambers time charts 22 and 24, the second and third low-vacuum pumps 12e and 14e, respectively, should be operated during the fifth and eighth time sections 22b and 24b, respectively, for maintaining the internal pressure during gas flow at the low-vacuum state. They also should be operated during the sixth and ninth time section 22c and 24c, respectively, to return the reaction chambers to the initial high-vacuum state. The third and fourth gate valves associated with the second reaction chamber remain open as illustrated by time chart 27. Similarly, the fifth and sixth gate valves associated with the third reaction chamber remain open as illustrated by time chart 28.

As described above and illustrated by time charts 26, 27 and 28, the first through sixth gate valves are always open regardless of the supply of reaction gas to the first through third reaction chambers illustrated by time charts 20, 22, and 24.

Note that the first through sixth high-vacuum pumps 10a, 10b, 12a, 12b, 14a and 14b and the first through third low-vacuum pumps 10e, 12e, and 14e can also always be on. Also, as shown in FIG. 1, note that each reaction chamber is connected in series to a pair of parallel high-vacuum pumps and one low-vacuum pump. Two gate valves are disposed between the pair of high-vacuum pumps and the single low-vacuum pump. The low-vacuum pump can be used when each reaction chamber is at an initial vacuum state as well as when the reaction gas is supplied to the reaction chamber; but, the low-vacuum pumps are unnecessary except for when the reaction gas is supplied to the reaction chamber.

In any case, a LPCVD apparatus for fabricating a semiconductor device by the conventional technology requires many vacuum pumping components, which require a large amount of management, maintenance, expense, and floor space diverted from valuable semiconductor fabrication facilities.

SUMMARY OF THE INVENTION

Accordingly, to solve one or more of the problems described above, it is an object of the present invention to provide a low pressure chemical vapor deposition apparatus for fabricating a semiconductor device which can maximize the efficiency of a plurality of reaction chambers and pumps connected thereto and simultaneously reduce the amount and size of the pumping apparatus for increased ease of maintenance.

It is another object of the present invention to provide a method for fabricating a semiconductor device using the low pressure chemical vapor deposition apparatus with the reduced amount and size of pumping apparatus attached thereto.

The apparatus for low pressure chemical vapor deposition for fabricating a semiconductor device comprises a first group of reaction chambers, a second group of high-vacuum pumps connected to the reaction chambers, a third group of gate valves connected to the high-vacuum pumps, and a low-vacuum pump connected to the gate valves. The third group has fewer members than the second group.

In other aspects of the invention, each high-vacuum pump is connected to a single reaction chamber, the third group has the same number of members as the first group, and each gate valve communicates with a corresponding reaction chamber. It is still another aspect of the invention to have an automatic pressure controller connected to the gate valves and the reaction chambers.

The method comprises loading wafers sequentially into the reaction chambers, pumping to high vacuum, opening one gate valve communicating with a designated reaction chamber which is to receive a predetermined reaction gas, pumping to low vacuum, injecting the reaction gas into the designated reaction chamber at a predetermined start time and for a predetermined duration for the designated reaction chamber, closing the gate valve, and ceasing the pumping to low vacuum if all the gate valves are closed. The steps after the high-vacuum pumping are repeated for the other reaction chambers in a predetermined sequence. In another aspect of the method, the gates are left open for the entire process.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
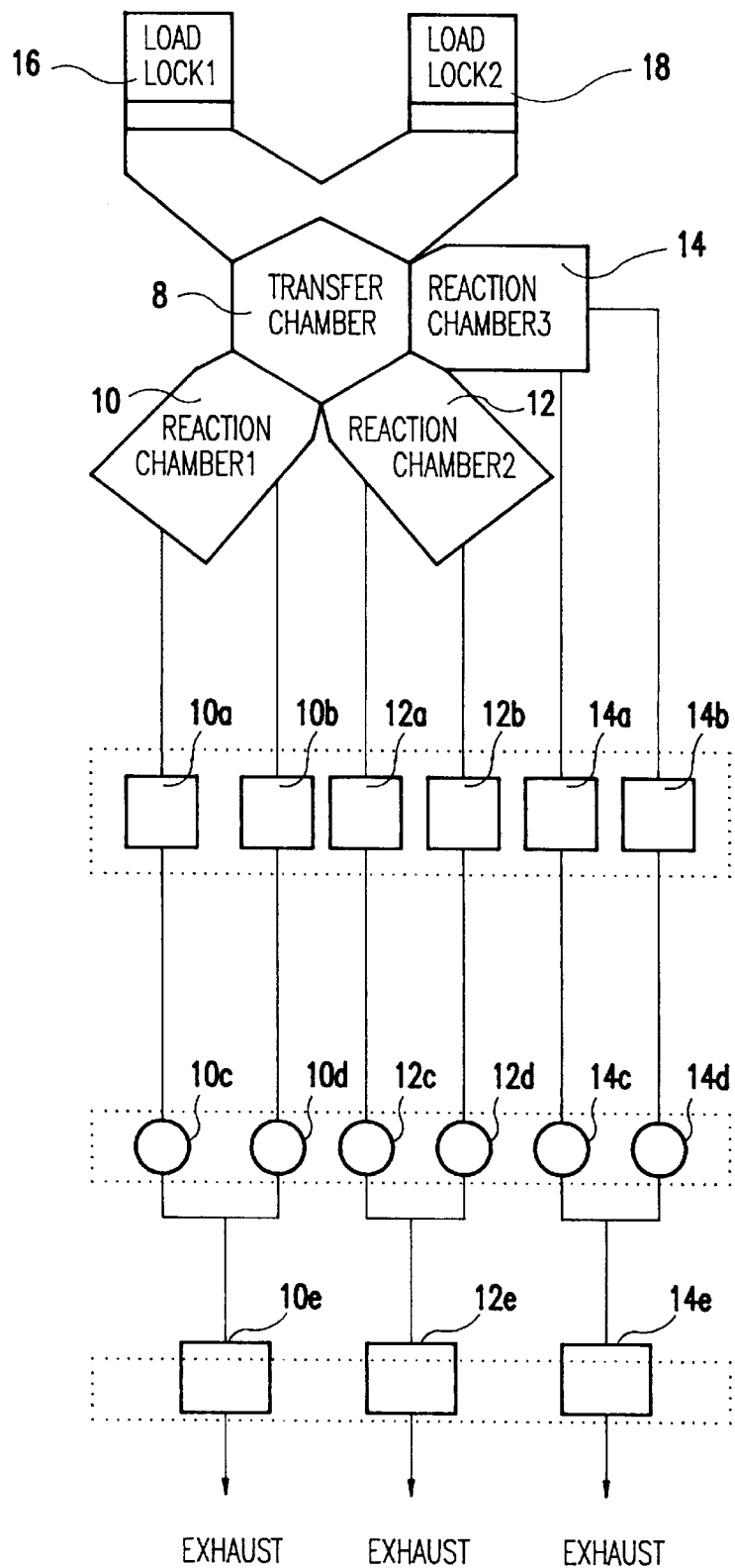
FIG. 1 is a schematic diagram of the structural relationship between reaction chambers and pump components in a low pressure chemical vapor deposition (LPCVD) apparatus for fabricating a semiconductor device by the conventional technology.
Figure 2:
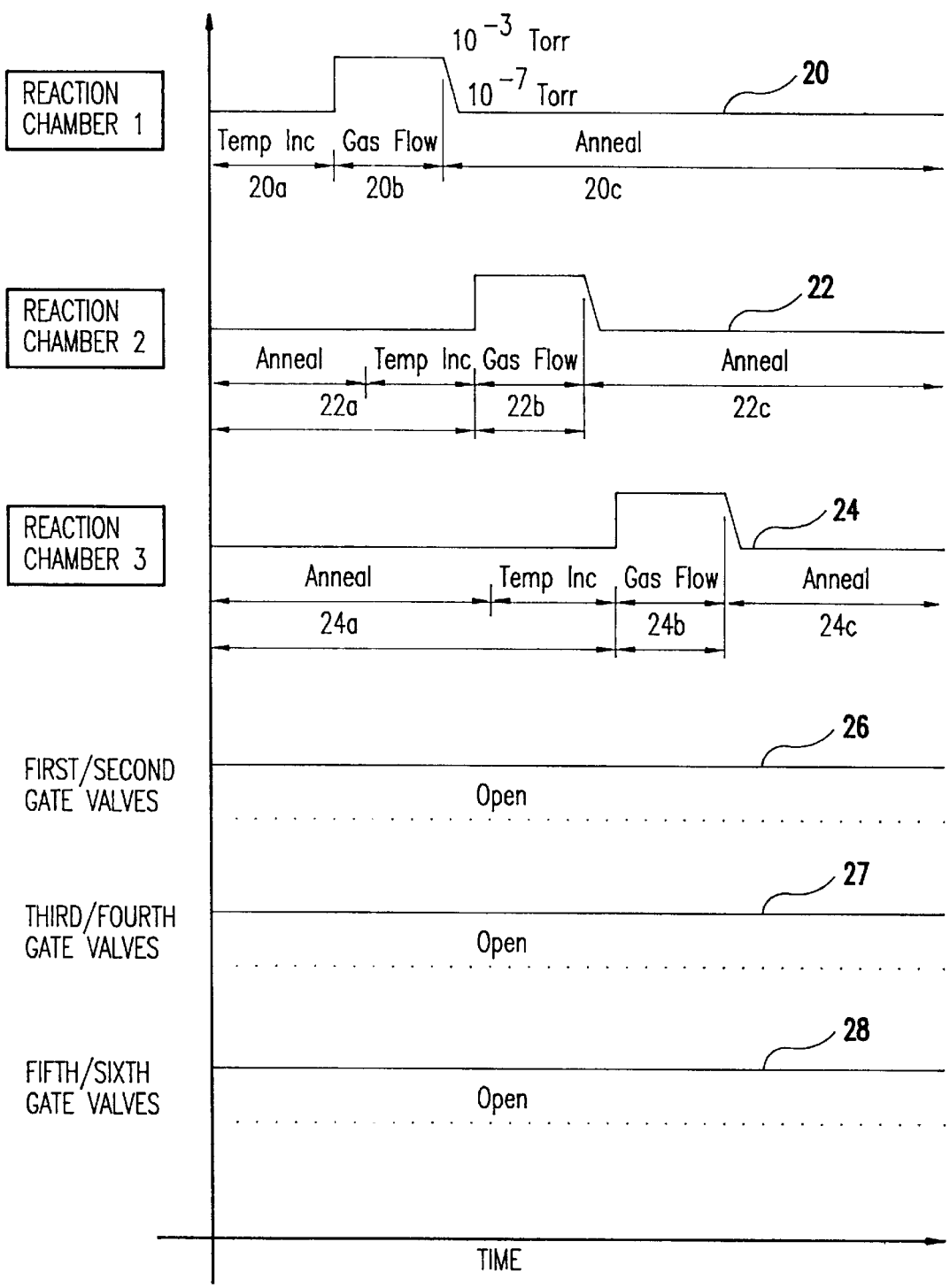
FIG. 2 is a graph of time charts that illustrate a method for performing, LPCVD for fabricating, a semiconductor device using, the conventional technology.
Figure 3:
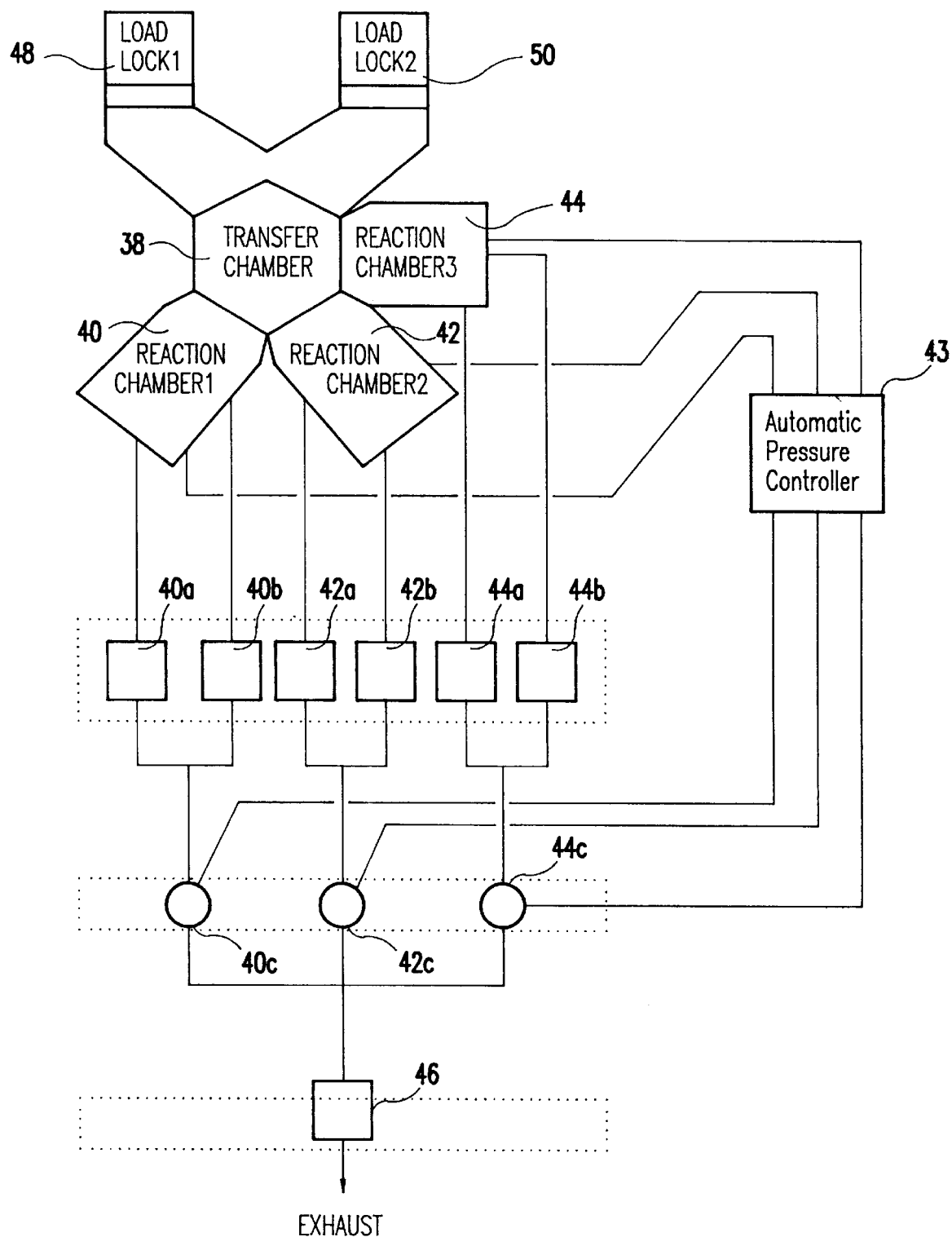
FIG. 3 is a schematic diagram of the structural relationship between reaction chambers and pump components in a LPCVD apparatus for fabricating a semiconductor device according to one embodiment of the present invention.

FIG. 3 shows an LPCVD apparatus for fabricating a semiconductor device according to a first apparatus embodiment of the present invention. This embodiment has three reaction chambers, namely, a first reaction chamber 40, second reaction chamber 42, and third reaction chamber 44 that are connected to a wafer transfer chamber 38. A first load lock chamber 48 and second load lock chamber 50 are also connected to the transfer chamber 38. In general, a plurality of high-vacuum pumps are connected in parallel to each of the first through third reaction chambers 40, 42 and 44. In the embodiment of FIG. 3, a pair of high-vacuum pumps are connected in parallel to each reaction chamber. The first and second high-vacuum pumps 40*a* and 40*b* are connected in parallel to the first reaction chamber 40, the third and fourth high-vacuum pumps 42*a* and 42*b* are connected in parallel to the second reaction chamber 42, and the fifth and sixth high-vacuum pumps 44*a* and 44*b* are connected in parallel to the third reaction chamber 44. The first through sixth high-vacuum pumps 40*a*, 40*b*, 42*a*, 42*b*, 44*a* and 44*b* are either ion pumps or turbo pumps.

Gate valves are connected in series to each pair of high-vacuum pumps. In general, the number of gate valves is less than the number of high-vacuum pumps. In the embodiment of FIG. 3, a first gate valve 40*c* is connected to the first and second high-vacuum pumps 40*a* and 40*b*. In a similar manner the second and third gate valves 42*c* and 44*c* are connected to the third and fourth high-vacuum pumps 42*a* and 42*b*, and the fifth and sixth high-vacuum pumps 44*a* and 44*b*, respectively.

In the present invention, fewer low-vacuum pumps than reaction chambers are commonly connected to the first through third gate valves 40*c*, 42*c* and 44*c*. In the embodiment of FIG. 3, a single low-vacuum pump 46, which may be a dry pump, is connected to the first through third gate valves 40*c*, 42*c* and 44*c*. An optional automatic pressure controller 43 can be further provided between each reaction chamber and its corresponding gate valve for stabilizing the internal pressure of the first through third reaction chambers 40, 42 and 44, respectively.

In a second apparatus embodiment of the present invention, the first through third gate valves 40*c*, 42*c* and 44*c* are removed and the single low-vacuum pump 46 may be directly connected to the high-vacuum pumps 40*a*, 40*b*, 42*a*, 42*b*, 44*a*, and 44*b*. In both apparatus embodiments, since the single low-vacuum pump 46 must maintain the low-vacuum state of a plurality of reaction chambers simultaneously, the low-vacuum pump 46 must have a larger pumping capacity than in the conventional apparatus.

A significant characteristic of the two apparatus embodiments according to the present invention is that the size of the entire installation is significantly reduced as compared to the conventional LPCVD apparatus. Furthermore, a reduction in the size of the installation and the number of components thereof allows more simplified management of the installation. Also, since a single low-vacuum pump is involved, manipulation is simpler than when three low-vacuum pumps have to be controlled in concert as in the conventional LPCVD apparatus.

Figure 4:
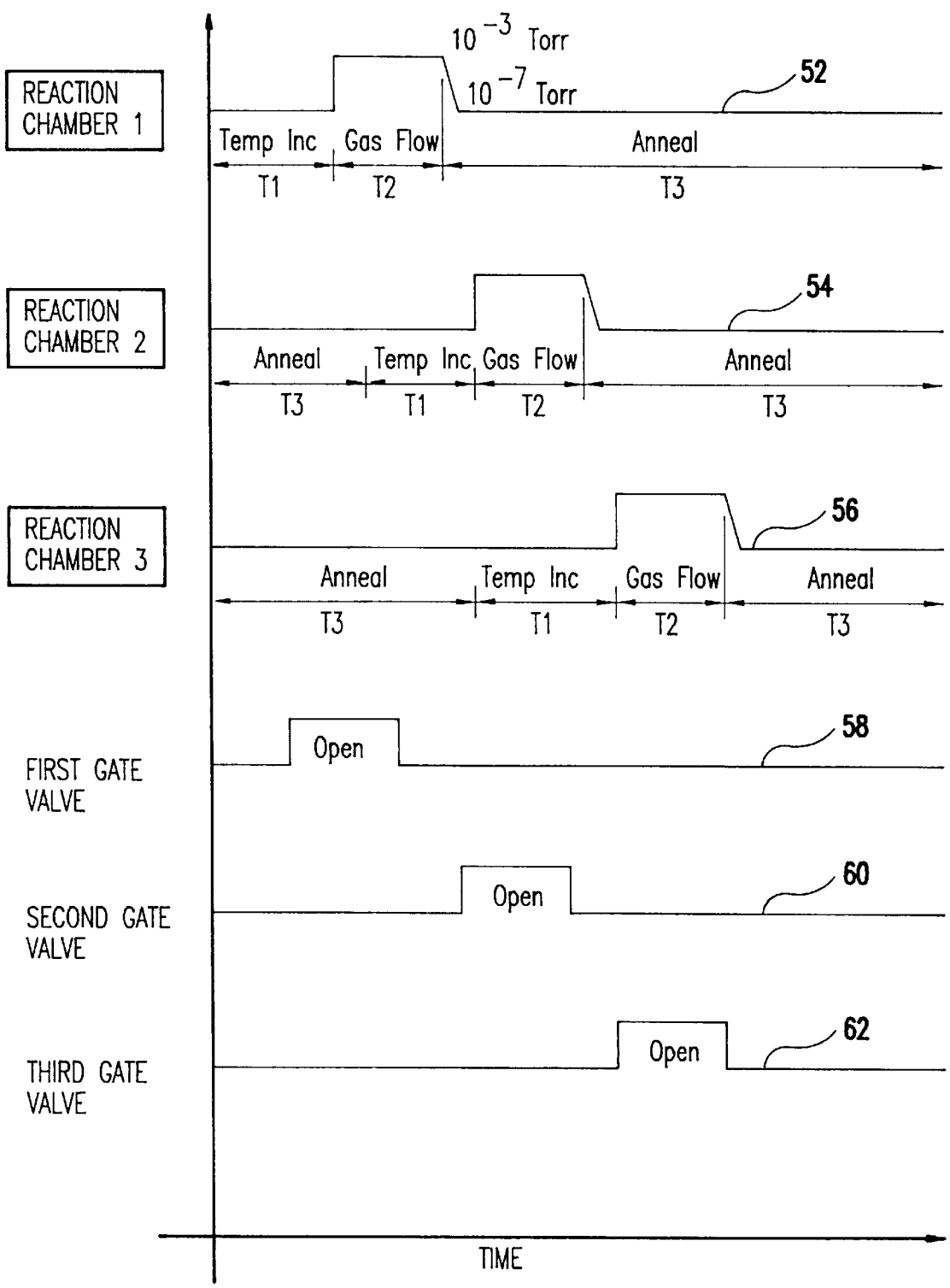
FIG. 4 is a graph of time charts that illustrate a first method of the present invention for performing LPCVD for fabricating a semiconductor device using the embodiment of the present invention depicted in FIG. 3.
Figure 5:
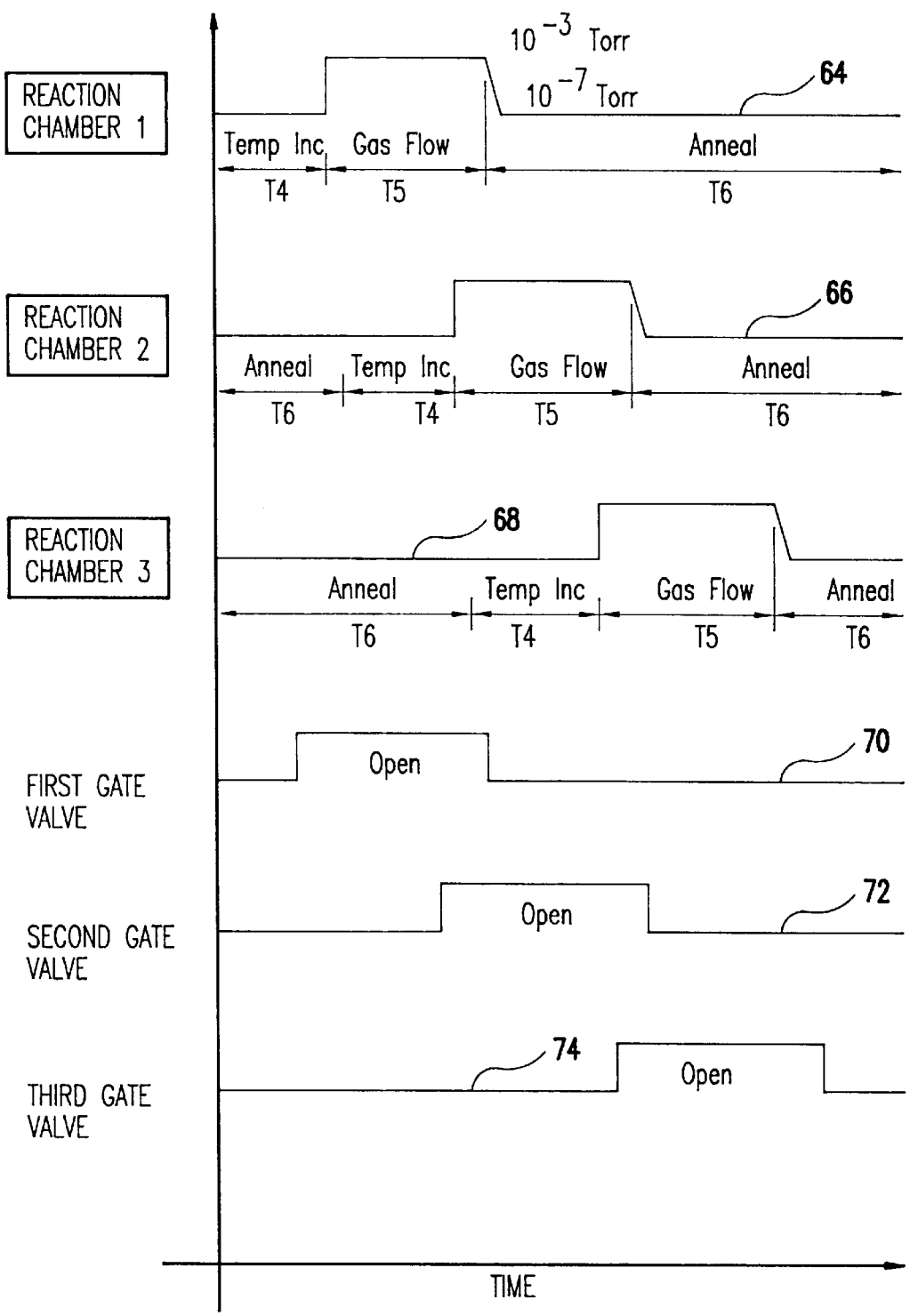
FIG. 5 is a graph of time charts that illustrate a second method of the present invention for performing LPCVD for fabricating a semiconductor device using the embodiment of the present invention depicted in FIG. 3.
Figure 6:
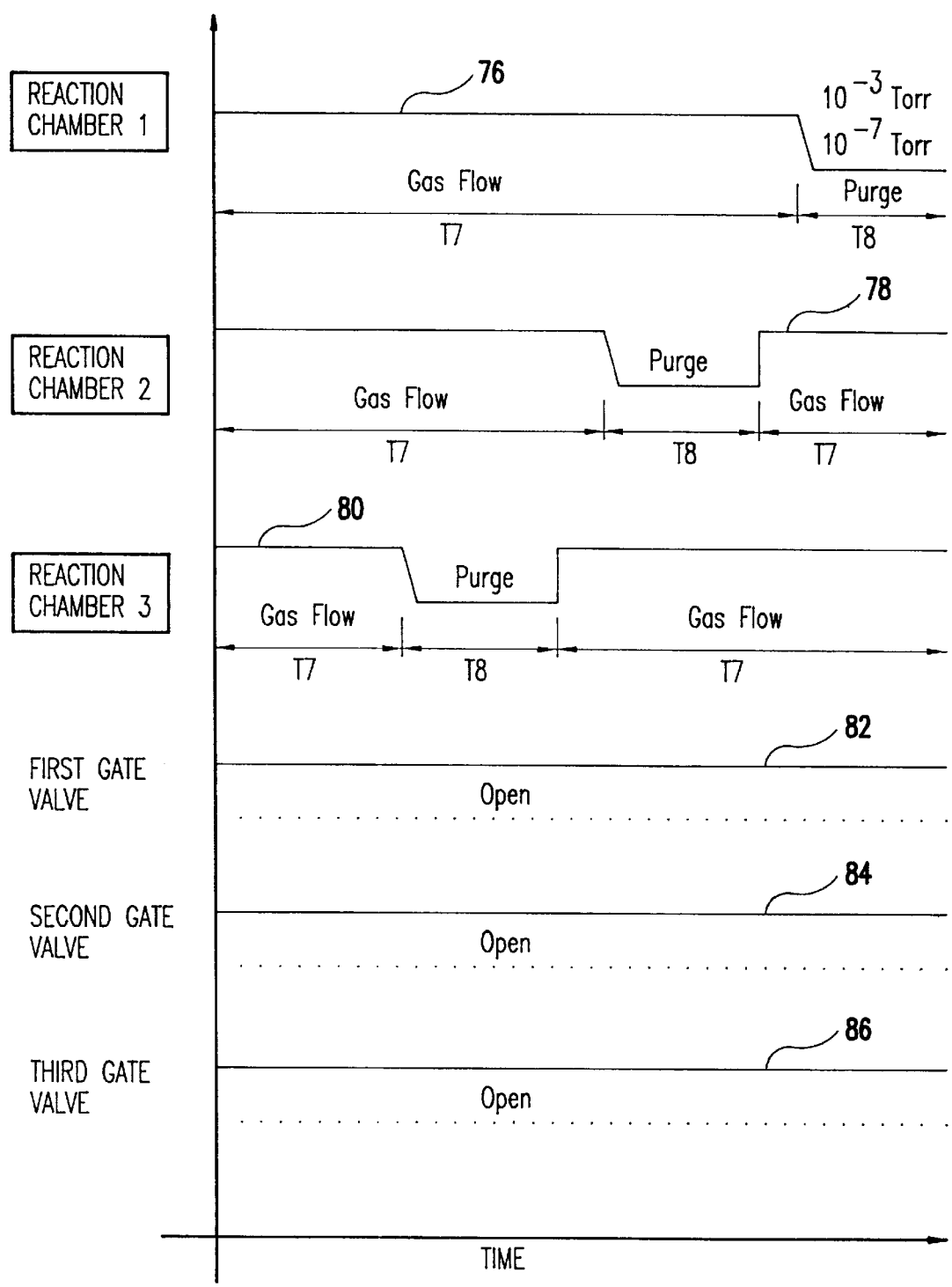
FIG. 6 is a graph of time charts that illustrate a third method of the present invention for performing LPCVD for fabricating a semiconductor device using the embodiment of the present invention depicted in FIG. 3.

Next, three embodiments of methods of using the LPCVD apparatus of FIG. 3 for fabricating a semiconductor device are described. The first method embodiment is illustrated in FIG. 4, the second method embodiment is illustrated in FIG. 5, and the third method embodiment is illustrated in FIG. 6. To better illustrate the three methods, they will be described with respect to a process for forming thin films on wafers, and in particular to a process for forming a thin film comprising a hemispherical grain (HSG) in which silane ($SiH_4$) or disilane ($Si_2H_6$) is used as the reaction gas.

The first method embodiment of the present invention is described wherein the reaction gas is introduced into the reaction chambers 40, 42, and 44 of FIG. 3 sequentially. Here the first through third gate valves 40c, 42c, and 44c open or close according to the injection of gas into the first through third reaction chambers, respectively. For the first method embodiment, FIG. 4 shows the time charts for the pressure state of the first through third reaction chambers and the open or closed state of the first through third gate valves. The horizontal axis of FIG. 4 indicates the time required for each process. The vertical axis includes the pressure state of the first through third reaction chambers on time charts 52, 54 and 56 respectively, and the open/close state of the first through third gate valves on time charts 58, 60 and 62 respectively. In this first method embodiment, each of the first through third reaction chambers has a distinctly different time period for injecting a gas, e.g., for forming a thin film, so that no more than one chamber receives an injected gas at any point in time.

In the first time section T1 ("Temp Inc") of first time chart 52, the internal pressure of the first reaction chamber is maintained at a high-vacuum state. For example, to form a thin film on a wafer, the wafer is heated to a predetermined temperature and then thermally stabilized during this time section while the internal pressure is maintained at a pressure of $10^{-7}$ Torr or below. Such a low pressure nearly eliminates the impurities that can settle on a wafer when forming a subsequent thin film. After the first time section T1, a reaction gas is supplied to the first reaction chamber 40 during a second time section T2 ("Gas Flow") of the first time chart 52. While the reaction gas is injected into the first reaction chamber 40, the internal pressure of the first reaction chamber 40 is raised, for example, to about $10^{-3}$ Torr for forming an HSG thin film. The third time section T3 ("Anneal") begins when the reaction gas is turned off. During the third time section T3 the gas is evacuated to bring the first reaction chamber back to a high vacuum state as shown by the first time chart 52. For example, after forming the thin film, the remaining gas within the first reaction chamber 40 is removed to prepare for the next process, and an annealing process is also performed to stabilize the thin film formed on the wafer, all during the third time section T3 of the first time chart 52. The processes occurring during the first through third time sections T1 through T3 are then repeated in the first reaction chamber 40.

The operation of the first gate valve 40c during the first through third time sections T1 through T3 of time chart 52 is shown in the fourth time chart 58. The first gate valve 40c is closed during time section T1 when the gas is not being injected as shown on time chart 58. The first gate valve 40c opens just before the reaction gas is injected into the first reaction chamber 40. For instance, during a thin film formation process the first gate valve 40c opens about 10 seconds before the reaction gas is injected into the first reaction chamber 40. That is, the first gate valve 40c opens on the fourth time chart 58 about the same time that the first time section T1 ends on the first time chart 52. The first gate valve 40c on the fourth time chart 58 stays open during the second time section T2 on the first time chart 52 when the reaction gas is injected into the first reaction chamber 40. For example, the second time section T2 is about 60 seconds for thin film formation. The first gate valve 40c remains open on the fourth time chart 58 for a predetermined period of time after the beginning of the third time section T3 on the first time chart 52. In the third time section T3 on the first time chart 52, the remaining gas in the first reaction chamber 40 is evacuated, and the thin film formed on the wafer is stabilized. In the example of the thin film formation, the third time section T3 is about 60 seconds. During this interval, the internal pressure of the first reaction chamber returns to the same pressure of about $10^{-7}$ Torr as the initial pressure during time section T1.

The detailed operations of the first and second high-vacuum pumps 40a and 40b and the low-vacuum pump 46 connected to the first reaction chamber 40 during the first through third time sections T1 to T3 will now be described. The first reaction chamber 40 is maintained at a high vacuum state in the first and third time sections T1 and T3 of the first time chart 52. For this, the first and second high-vacuum pumps 40a and 40b are continuously pumped.

A small amount of gas accumulates between the first reaction chamber 40 and the first gate valve 40c before the start of the second time section T2 due to the pumping operations of the first and second high-vacuum pumps 40a and 40b. As a result, the pressure therebetween increases slightly. However, this small increase is alleviated since the first gate valve 40c opens before the beginning of the second time section T2.

In the second time section T2 of the first time chart 52, a reaction gas is injected into the first reaction chamber 40 thereby increasing the internal pressure of the reaction chamber, for example to about $10^{-1}$ to $10^{-4}$ Torr. Since the reaction gas is continually injected into the first reaction chamber during the second time section T2, a heavy load is applied to the first-and second high-vacuum pumps 40a and 40b. Because the first gate valve 40c has already opened, 10 seconds earlier than T2 in the example, the low-vacuum pump 46 is already operating when the second time section T2 begins on the first time chart 52. Thus the low-vacuum pump 46 operates together with the first and second high-vacuum pumps 40a and 40b throughout time section T2 on the first time chart 52.

As seen in the second time chart 54 and third time chart 56 for the second and third reaction chambers, respectively, the second time sections T2, in which reaction gases are injected, occur at different times in the three reaction chambers 40, 42, and 44. The operation of the second and third gate valves 42c and 44c, the third through the sixth high-vacuum pumps, 42a, 42b, 44a, and 44b, and the single low-vacuum pump 46 are all analogous to the operations described above for the first reaction chamber 40. The operations of the second and third gate valves 42c and 44c in coordination with the LPCVD processes in the second and third reaction chambers 42 and 44 can be easily determined and understood with reference to the fifth and sixth time charts 60 and 62, respectively.

When the pressure of the reaction chambers are to be maintained at the low vacuum state (for example at about $10^{-2}$ to $10^{-4}$ Torr) during the time sections marked T2 on the first, second and third time charts 52, 54 and 56, respectively, the high-vacuum pumps 40a, 40b, 42a, 42b, 44a, and 44b are not necessary. Even if only the low-vacuum pump 46 is used, the exemplary thin film forming process can be accurately performed. In a particular example, when the reaction gas is injected into a reaction chamber in a relatively small amount of about 30 sccm (Standard Cubic centimeters) the low-vacuum pump 46 can be used without increasing the capacity thereof because the low-vacuum pump 46 is only operating on one reaction chamber at a time.

However, when the reaction gas is simultaneously supplied to at least two reaction chambers, i.e., 40 and 42, 40 and 44, or 42 and 44, the specific components of the pumping system and the order of operation thereof should be changed. Therefore, a second method embodiment is described in which reaction gases are injected into two of the reaction chambers 40, 42, and 44 of FIG. 3 simultaneously.

FIG. 5 is used to explain the second method embodiment for using the present invention. In FIG. 5, as in FIG. 4, the horizontal axis again represents the time for a process, and the vertical axis again represents the pressure state of the first through third reaction chambers 40, 42, 44 and the open/close state of the first through third gate valves 40c, 42c, 44c, and time charts 64, 66, 68, 70, 72, and 74 will be referred to as the seventh through the twelfth time chart, respectively. According to the second method embodiment, the time of initial high-vacuum (required to bring the surface of the wafer to thermal equilibrium by heating in the thin film example) is referred to as a fourth time section T4, the time of low-vacuum gas injection (required to form a thin film on the wafer in the example) is referred to as a fifth time section T5, and the remaining low vacuum time (required to anneal the wafer on which the thin film is formed, for example) is referred to as a sixth time section T6.

In the second method embodiment, the durations of the fourth through sixth time sections T4 to T6 in FIG. 5 are different from the first through third time sections T1 to T3 in FIG. 4. That is, in the second method embodiment, the fifth time section T5 for supplying a reaction gas to a reaction chamber is longer than the corresponding second time section T2 in FIG. 4. On the contrary, the fourth and sixth time sections T4 and T6 of the second method embodiment are shorter than the corresponding first and third time sections T1 and T3 of FIG. 4. Thus, in the second embodiment, the length of the fifth time section T5 ("Gas Flow") for one reaction chamber partly overlaps the fifth time section T5 ("Gas Flow") for another reaction chamber. This means that a reaction gas is supplied simultaneously in at least two reaction chambers. This situation will be described considering the first and second reaction chambers's 40, 42 time charts 64 and 66.

The seventh time chart 64 of FIG. 5 for the first reaction chamber 40 begins with a fourth time section T4 when, for example, a wafer is heated to a temperature suitable for forming a thin film to ensure that the surface of the wafer is in thermal equilibrium. Simultaneously, for the second reaction chamber 42 the eighth time chart 66 begins with a sixth time section T6, for example, an annealing process performed after a thin film deposition. On the seventh time chart 64 corresponding to the first reaction chamber 40, the fourth time section T4 is followed by a fifth time section T5 when a reaction gas is injected, for example when HSG nuclei are deposited as a thin film on a wafer by injecting a gas such as disilane gas at a constant rate into the first reaction chamber 40. The fifth time section T5 is longer than the corresponding second time section T2 of FIG. 4 in the first embodiment. During the fifth time section T5 of the seventh time chart 64, the sixth time section T6 of the eighth time chart 66 continues in the second reaction chamber 42.

When the fifth time section T5 has begun on the eighth time chart 66 for the second reaction chamber 42, the seventh time chart 64 for the first reaction chamber 40 is still in the fifth time section T5. Thus, a reaction gas is simultaneously supplied to the first and second reaction chambers 40, 42 during the time between the starting point of the fifth time section T5 of the eighth time chart 66 and the ending point of the fifth time section T5 of the seventh time chart 64.

The reaction gases supplied to the first and second reaction chambers 40, 42 during T5 on the seventh and eighth time charts 64 and 66 may be different. While the reaction gases are simultaneously supplied to the first and second reaction chambers 40, 42 on the seventh and eighth time charts 64 and 66, the operations of the first and second gate valves 40c and 42c connected to the first and second reaction chambers 40 and 42 can be seen in the tenth and eleventh time charts 70 and 72. For example, as in the first embodiment, the first gate valve 40c opens on the tenth time chart 70 about 10 seconds before the occurrence of the fifth time section T5 on the seventh time chart 64, and remains open until the internal pressure on the seventh time chart 64 becomes equal to the initial pressure level. In the same way, the second gate valve 42c on the eleventh time chart 72 opens before the occurrence of the fifth time section T5 on the eighth time chart 66 and remains open until the internal pressure on the eighth time chart 66 becomes equal to an initial pressure level. In the example, both the first and second gate valves 40c, 42c on the tenth and eleventh time charts 70 and 72 may be open for up to about 200 seconds.

The opening of the first and second gate valves 40c, 42c on the tenth and eleventh time charts 70 and 72 means that the low-vacuum pump 46 operates. Unlike the first method embodiment, the low-vacuum pump 46 must simultaneously pump the first and second reaction chambers 40, 42 for a predetermined period of time. Thus, the capacity of the low-vacuum pump 46 should be enhanced so as to be able to produce an equivalent vacuum state in each reaction chamber. The capacity needed from the low-vacuum pump 46 is determined by the amount of reaction gas injected into the two reaction chambers 40, 42. In general, when the reaction gas is simultaneously supplied to two reaction chambers, the capacity of the low-vacuum pump 46 must be doubled; when the reaction gas is simultaneously supplied to all three reaction chambers, the capacity must be increased three-fold. In a more particular example, when a reaction gas of 30 sccm is injected into a reaction chamber and the low-vacuum pump 46 has a pumping capacity of 10000 liters per minute, a pumping capacity of 15000 liters per minute would at least be required to simultaneously pump the reaction gas from the two reaction chambers. The capacity of the low-vacuum pump 46 is determined in accordance with the following: the type and reaction temperature of the reaction gas supplied to the two reaction chambers; the volume of the two reaction chambers; the capacity of the high-vacuum pumps; and the size of an exhaust pipe.

The description of this second embodiment can be competed by referring to FIG. 3. Although the first and second reaction chambers 40 and 42 were selected to describe the second embodiment, an analogous description can be employed when the reaction gas is supplied simultaneously to the first and third reaction chambers 40 and 44, the second and third reaction chambers 42 and 44, or all three reaction chambers 40, 42 and 44.

In the second embodiment, at least two gate valves are simultaneously open for a predetermined time, but the valves open and close at different times. Thus, when the second gate valve 42c is opened or closed while the first gate valve 40c is opened, the pressure of the first reaction chamber 40 can be momentarily changed. To alleviate the impact of the momentary pressure change on the reaction chamber, an automatic pressure controller 43 may be installed between the gate valves 40c, 42c and 44c and their corresponding reaction chambers 40, 42 and 44, respectively.

A third method embodiment of the present invention is described wherein the reaction gas is introduced into all three reaction chambers 40, 42, and 44 for most of the processing time. In FIG. 6, the horizontal axis again denotes the time in which the LPCVD process is carried out, and the vertical axis again denotes the pressure state time charts for the first through third reaction chambers 40, 42 and 44 and the open state time charts for the first through third gate valves 40c, 42c and 44c in the time charts 76, 78, 80, 82, 84, and 86, respectively (hereinafter, referred to as the thirteenth time chart through the eighteenth time chart, respectively). Unlike the first and second method embodiments, where the pressure state time charts each have three time sections (i.e., T1 to T3 for FIG. 4 and T4 to T6 for FIG. 5), the thirteenth to fifteenth time charts 76, 78, and 80 in FIG. 6 have only two time sections T7 and T8, respectively. The seventh time section T7 denotes a time in which a reaction gas is supplied. The eighth time section T8 denotes a time required for purging the remaining gas from a reaction chamber after the supply of reaction gas is terminated. As seen from the thirteenth to fifteenth time charts 76, 78, and 80, the seventh time section T7 is much longer than the eighth time section T8. For example, the thin film forming process occurring in the first through third reaction chambers 40, 42, and 44 in the third embodiment consists of a reaction gas supply process and a shorter reaction gas purging process wherein the remaining gas within a reaction chamber is evacuated.

Since the reaction gas is simultaneously supplied to the first through third reaction chambers on the thirteenth through fifteenth time charts 76, 78, and 80, during almost the entire process, the first through third gate valves are always open on the sixteenth through eighteenth time charts 82, 84 and 86. Therefore the low-vacuum pump 46 must be operating during almost the entire process.

The remainder of the third method embodiment is described with reference to FIG. 3. As in the first and second- embodiments, the first through sixth high-vacuum pumps 40a, 40b, 42a, 42b, 44a and 44b continuously operate while operating the LPCVD, such as while performing a thin film forming process. For example, the first through sixth high-vacuum pumps 40a, 40b, 42a, 42b, 44a and 44b are used to maintain the pressure of the first through third reaction chambers 40, 42 and 44 at a low pressure of about $10^{-4}$Torr to $10^{-10}$ Torr. A turbo or ion pump is used as the first through sixth high-vacuum pumps 40a, 40b, 42a, 42b, 44a and 44b.

Since there is only one low-vacuum pump 46, the pumping capacity thereof should be increased. Thus, a low-vacuum pump capable of simultaneously evacuating the reaction gas injected into all three reaction chambers must be installed and used. For example, the low-vacuum pump 46 is used to maintain the pressure of the first through third reaction chambers 40, 42 and 44 at less than $10^{-4}$ Torr. Alternatively, additional low-vacuum pumps could be added and still retain a number of low-vacuum pumps less than the number of reaction chambers. A dry pump is suitable for the low-vacuum pump 46.

In the third embodiment, the first through third reaction chambers 40, 42 and 44 open at the gate valves 40c, 42c, and 44c at the same time so that a reaction gas is continuously provided thereto. Here, the time for opening the first through third reaction chambers 40, 42 and 44 far exceeds the time for closing them. Thus, when one of the gate valves for the reaction chambers is closed and then opened, the pressure of the other reaction chambers can be changed. In order to minimize such a pressure change, the automatic pressure controller 43 is installed between each reaction chamber 40, 42 and 44 and the corresponding gate valve 40c, 42c and 44c, respectively.

Alternatively, for the third method embodiment, the cost for installing the pumping equipment can be reduced and the pumping capacity of the pumping equipment can be improved by removing the first through third gate valves 40c, 42c and 44c and directly connecting the first through third reaction chambers 40, 42 and 44 to the low-vacuum pump 46 through the corresponding high-vacuum pumps, 40a and 40b, 42a and 42b, and 44a and 44b, respectively.

For any of the method embodiments, the LPCVD can comprise the HSG nuclei formation process using disilane ($Si_2H_6$) as a reaction gas, or any other thin film formation process that may be used to fabricate a semiconductor device.

In summary, in the LPCVD apparatus and the method for using the same according to the present invention, the number of low-vacuum pumps is less than the number of the reaction chambers supported thereby and the number of gate valves is less than the number of high-vacuum pumps connected thereto. As necessary, an automatic pressure controller can be provided in addition between the gate valves and the plurality of reaction chambers. Also, the pumps can be directly connected to the reaction chambers to improve the pumping capability thereof. Though there can be various embodiments in the method using the pumping equipment connected to the plurality of reaction chambers having such a configuration, the three disclosed embodiments are taken as examples.

According to the present invention, since the number of pumps is greatly reduced as a whole, the entire cost for installation, operation and maintenance of the LPCVD apparatus is reduced. Also, since the area required for installing the LPCVD apparatus is sharply reduced, the extra space in the facility requiring the LPCVD apparatus, such as a clean room, can be used for other purposes so the cost of the whole facility goes down. Finally, the cost for installing and operating the pumping equipment of the LPCVD apparatus is also reduced.

The present invention is not limited to the embodiments particularly described above, it being apparent that those skilled in the art can effect various modifications to these embodiments which will remain within the technical spirit and scope of the present invention as defined by the appended claims and their equivalents.

What is claimed is:

1. A method for fabricating a semiconductor device using an apparatus for low pressure chemical vapor deposition, the method comprising:

loading wafers sequentially into a first group of reaction chambers;

pumping a designated one of said reaction chambers to a high vacuum using a second group of high-vacuum pumps connected to said reaction chambers wherein each high-vacuum pump of said second group being connected to a single reaction chamber of said first group;

opening one gate valve of a third group of gate valves, wherein said third group having the same number of members as said first group and said third group having fewer members than said second group, and wherein each gate valve of said third group communicating with a corresponding reaction chamber of said first group through those of said high-vacuum pumps which are connected to said corresponding reaction chamber, and wherein said opened gate valve communicates with the designated reaction chamber which is to receive a reaction gas;

pumping the designated reaction chamber to a low vacuum using a low-vacuum pump being connected to said gate valves;

injecting said reaction gas into said designated reaction chamber at a start time and for a duration;

closing said opened gate valve;

ceasing pumping to low vacuum all of said gate valves of said third group are closed; and repeating said opening, said pumping to low vacuum, said injecting, said closing, and said ceasing steps for other of said reaction chambers in a sequence.

2. The method of claim 1, wherein during said opening step another of said gate valves is opened, and said low-vacuum pump has sufficient capacity to maintain a target low-vacuum pressure in those of said corresponding reaction chambers communicating with the opened gate valves.

3. The method of claim 1, wherein said pumping step to high vacuum maintains the internal pressure of each reaction chamber of said first group in the range from about $10^{-4}$ Torr to about $10^{-10}$ Torr.

4. The method of claim 1, wherein said pumping step to low vacuum maintains the internal pressure of each reaction chamber of said first group in the range from about $10^{-4}$ Torr to about $10^{-4}$ Torr.

5. The method of claim 1, wherein said pumping step to low vacuum and said injecting steps are separated by a pre-injection pumping duration, and said closing and said injection steps are separated by a post-injection pumping duration.

6. The method of claim 5, wherein during said pumping step to low vacuum all of said gate valves are open; and said low-vacuum pump has sufficient capacity to maintain a target low-vacuum pressure in all of said reaction chambers.

* * * * *